United States Patent
Ball

(10) Patent No.: US 7,388,413 B1
(45) Date of Patent: Jun. 17, 2008

(54) RAMP GENERATOR WITH FAST RESET

(75) Inventor: Newton E. Ball, Anaheim, CA (US)

(73) Assignee: Microsemi Corporation, Irvine, CA (US)

( * ) Notice: Subject to any disclaimer, the term of this patent is extended or adjusted under 35 U.S.C. 154(b) by 17 days.

(21) Appl. No.: 11/181,649

(22) Filed: Jul. 14, 2005

(51) Int. Cl.
*H03M 1/10* (2006.01)

(52) U.S. Cl. ..................... 327/131; 327/137

(58) Field of Classification Search ............... 327/91, 327/93, 94, 96, 131–138, 140, 337, 390, 327/544; 330/10; 332/109
See application file for complete search history.

(56) References Cited

U.S. PATENT DOCUMENTS

| | | | | |
|---|---|---|---|---|
| 3,586,874 A | 6/1971 | Ferro | ......................... | 327/137 |
| 4,227,124 A | 10/1980 | Elliott, Jr. | ................... | 315/408 |
| 4,355,240 A | 10/1982 | Hamilton | .................... | 307/44 |
| 4,490,653 A | 12/1984 | Olmstead | .................... | 315/403 |
| 4,885,585 A | 12/1989 | Barrow et al. | ............. | 341/169 |
| 4,926,131 A * | 5/1990 | Leydier | ..................... | 327/126 |
| 5,166,630 A * | 11/1992 | Lee | ............................. | 327/554 |
| 5,336,242 A * | 8/1994 | Zadeh | .......................... | 607/11 |
| 5,424,670 A * | 6/1995 | Samuels et al. | ............ | 327/337 |
| 5,574,392 A | 11/1996 | Jordan | ......................... | 327/131 |
| 5,604,685 A * | 2/1997 | Seesink et al. | ............... | 702/86 |
| 5,642,066 A | 6/1997 | Burke | ......................... | 327/132 |
| 5,670,915 A * | 9/1997 | Cooper et al. | .............. | 331/111 |
| 5,724,000 A * | 3/1998 | Quinn | ......................... | 327/554 |
| 5,760,623 A | 6/1998 | Hastings | ..................... | 327/137 |
| 5,769,873 A * | 6/1998 | Zadeh | .......................... | 607/29 |
| 5,804,999 A | 9/1998 | DeBoer et al. | ............. | 327/110 |
| 5,886,562 A * | 3/1999 | Garrity et al. | .............. | 327/415 |
| 6,020,792 A * | 2/2000 | Nolan et al. | ................. | 331/111 |
| 6,172,489 B1 | 1/2001 | Walker | ........................ | 323/237 |
| 6,194,946 B1 * | 2/2001 | Fowers | ....................... | 327/337 |
| 6,326,859 B1 * | 12/2001 | Goldman et al. | ........... | 331/143 |
| 6,366,231 B1 * | 4/2002 | Rao et al. | ................... | 341/166 |
| 6,388,505 B1 * | 5/2002 | Ribellino et al. | ........... | 327/536 |
| 6,400,232 B1 * | 6/2002 | Good et al. | ................. | 331/143 |
| 6,522,115 B1 | 2/2003 | Greitschus | .................. | 323/288 |
| 6,608,521 B1 * | 8/2003 | Baldwin et al. | .............. | 330/10 |
| 6,646,513 B1 * | 11/2003 | Neidorff | ...................... | 331/143 |
| 6,791,405 B2 * | 9/2004 | Tsuji et al. | ................... | 330/10 |
| 6,819,154 B2 * | 11/2004 | Greenfeld | .................... | 327/172 |
| 6,900,440 B2 | 5/2005 | Reed et al. | ............. | 250/338.1 |
| 6,956,431 B2 * | 10/2005 | Maejima | ..................... | 330/10 |

\* cited by examiner

*Primary Examiner*—N. Drew Richards
*Assistant Examiner*—Thomas J Hiltunen
(74) *Attorney, Agent, or Firm*—Knobbe, Martens, Olson & Bear LLP

(57) ABSTRACT

An efficient ramp generator uses a reversing switch array to couple a timing capacitor in alternating polarities between an input terminal and an output terminal of an operational amplifier to generate a periodic ramp signal without discharging the timing capacitor between voltage ramps. The reversing switch array includes at least four semiconductor switches controlled by a flip-flop circuit or a latch circuit. The flip-flop circuit or the latch circuit can be driven by an external clock signal or an internal clock signal with a variable frequency.

20 Claims, 4 Drawing Sheets

RAMP GENERATOR WITH FAST RESET

BACKGROUND

1. Field of the Invention

The invention generally relates to a ramp voltage generator in a pulse width modulation system, and more particularly, relates to a ramp voltage generator that uses an integrator circuit with a reversing switch array.

2. Description of the Related Art

A periodic ramp voltage waveform is typically used to establish time intervals in pulse width modulation (PWM) systems. An integrator circuit comprising a current source and a capacitor is generally used to generate the periodic ramp voltage waveform. For example, the current source charges the capacitor at a constant rate to establish a voltage that increases with time (or ramp voltage) and the capacitor is periodically discharged to its starting voltage. The periodic discharge (or reset) of the capacitor between voltage ramps disadvantageously takes time (e.g., typically 5% of the waveform period) and the associated high discharge current may disturb power supply voltage levels (e.g., through power supply sag or ground bounce).

SUMMARY

The present invention proposes an efficient ramp voltage generator that eliminates resetting of a capacitor (or high discharge current) by periodically reversing polarity of the capacitor with a reversing switch array. For example, the charge on the capacitor does not change during a transition (or reset time) from the end of one ramp voltage to the beginning of the next ramp voltage in a periodic ramp signal. Accordingly, the reset time (or dead time in a PWM system) is reduced. In addition, the high discharge current (or reset current) and its side effects are effectively eliminated. The periodic ramp signal can be provided to a comparator to establish time intervals and to generate a variable pulse-width signal with capability for higher duty cycles in the PWM system.

In one embodiment, a ramp generator includes a capacitor, an operational amplifier and a switch array. The operational amplifier has a non-inverting input terminal coupled to a reference voltage and an inverting input terminal coupled to a current source. An output of the operational amplifier provides a periodic ramp signal. The switch array couples the capacitor in alternating polarity between the inverting input terminal and the output terminal of the operational amplifier. For example, the switch array periodically reverses the connection of the capacitor between the inverting input terminal and the output terminal of the operational amplifier such that the charge on the capacitor does not change substantially when the periodic ramp signal transitions from one ramp to the next ramp.

In one embodiment, the switch array includes at least four semiconductor switches. For example, a first semiconductor switch is coupled between a first terminal of the capacitor and the inverting input terminal of the operational amplifier. A second semiconductor switch is coupled between the first terminal of the capacitor and the output terminal of the operational amplifier. A third semiconductor switch is coupled between a second terminal of the capacitor and the inverting input terminal of the operational amplifier. A fourth semiconductor switch is coupled between the second terminal of the capacitor and the output terminal of the operational amplifier.

The first and the fourth semiconductor switches operate as a first pair (or set) of switches to couple the capacitor in a first polarity between the output terminal and the inverting input terminal of the operational amplifier. For example, the first set of switches conduct such that the current source charges the capacitor in a first direction and the periodic ramp signal increases from an initial value to a final value. The second and the third semiconductor switches operate as a second pair (or set) of switches to couple the capacitor in a second polarity between the output terminal and the inverting input terminal of the operational amplifier. For example, the second set of switches conduct such that the current source charges the capacitor in a second (or opposite) direction and the periodic ramp signal increases from the initial value to the final value. The periodic ramp signal drops (or decreases) from the final value to the initial value without substantial changes to charges on the capacitor when the first set and the set of semiconductor switches change conduction states.

In one embodiment, the ramp generator further includes a flip-flop circuit to control the switch array. The flip-flop circuit outputs two alternately active signals (e.g., a Q output and a complementary Q output) with frequencies determined by a clock signal. In another embodiment, the ramp generator further includes a latch circuit to control the switch array. The latch circuit also outputs two alternately active signals (e.g., a Q output and a complementary Q output) with frequencies determined by a clock signal. The Q output can be used to control the first pair of semiconductor switches and the complementary Q output can be used to control the second pair of semiconductor switches.

The clock signal may be provided by an external source (or synchronized to an external clock signal). For example, at rising edges of the external clock signal, the outputs of the flip-flop circuit or the latch circuit change state. The clock signal may also be generated internally (or synchronized to an internal clock signal). In one embodiment, the internal clock signal is generated by sensing (or monitoring) the amplitude of the periodic ramp signal (e.g., by comparing the periodic ramp signal to a bias voltage). For example, the internal clock signal pulses when a ramp voltage of the periodic ramp signal is greater than the bias voltage and the outputs of the flip-flop circuit or the latch circuit change state to start another ramp voltage.

In one embodiment, the frequency of the internal clock signal (and correspondingly, the frequency of the periodic ramp signal) is variable by adjusting the level of the current source coupled to the inverting input terminal of the operational amplifier. For example, increasing the level of the current source increases the frequency of the internal clock signal and decreasing the level of the current source decreases the frequency of the internal clock signal. In one embodiment, the current source includes a first resistor coupled between the inverting input terminal of the operational amplifier and a reference node (e.g., ground) to determine a nominal level for the current source.

In one application, the current source further includes a second resistor coupled between a control voltage and the inverting input terminal of the operational amplifier. The level of the current source is adjusted by varying the control voltage. For example, increasing the control voltage above the reference voltage coupled to the non-inverting input terminal of the operational amplifier decreases the level of the current source from its nominal level while decreasing the control voltage below the reference voltage increases the level of the current source from its nominal level.

In another application, the current source further includes a variable-resistive network coupled in parallel with the first resistor. The level of the current source is adjusted by varying the impedance of the variable-resistive network. For example, increasing the impedance of the variable-resistive network decreases the level of the current source while decreasing the impedance of the variable-resistive network increases the level of the current source. In one embodiment, the variable-resistive network is realized with a metal-oxide-semiconductor field-effect-transistor (MOSFET) coupled in series with a third resistor. The impedance across source-to-drain terminals of the MOSFET is variable by an input control voltage applied to a gate terminal of the MOSFET.

For purposes of summarizing the invention, certain aspects, advantages and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate embodiments and are not intended to be limiting.

DETAILED DESCRIPTION OF EMBODIMENTS

Although particular embodiments are described herein, other embodiments, including embodiments that do not provide all of the benefits and features set forth herein, will be apparent to those of ordinary skill in the art.

Figure 1:
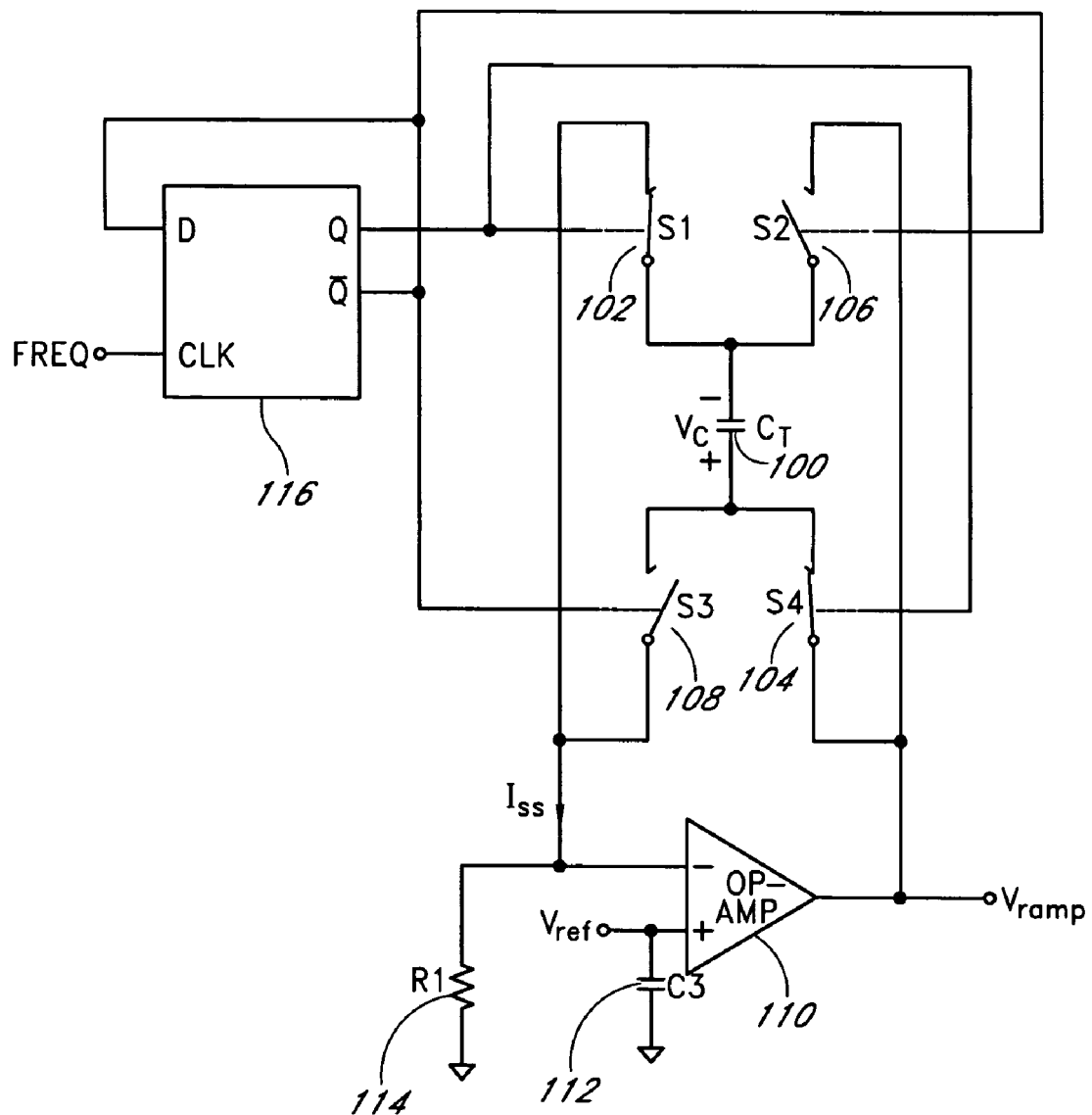
FIG. 1 illustrates one embodiment of a ramp generator with a reversing switch array controlled by a flip-flop circuit using an external clock signal.

FIG. 1 illustrates one embodiment of a ramp generator with a reversing switch array controlled by a flip-flop circuit 116 using an external clock signal (FREQ). The reversing switch array includes a first switch (S1) 102, a second switch (S2) 106, a third switch (S3) 108 and a fourth switch (S4) 104. The first switch 102 is coupled between a first terminal of a timing capacitor (CT) 100 and an inverting input terminal of an operational amplifier 110. The second switch 106 is coupled between the first terminal of the timing capacitor 100 and an output terminal of the operational amplifier 110. The third switch 108 is coupled between a second terminal of the timing capacitor 100 and the inverting input terminal of the operational amplifier 110. The fourth switch 104 is coupled between the second terminal of the timing capacitor 100 and the output terminal of the operational amplifier. In one embodiment, the reversing switch array is an electronic switch array and the switches 102, 104, 106, 108 are semiconductor switches (e.g., MOSFETs or bipolar junction transistors).

In one embodiment, a reference voltage (Vref) is provided to a non-inverting input terminal of the operational amplifier 110. An optional filter capacitor (C3) 112 is coupled between the non-inverting input terminal of the operational amplifier 110 and a reference node (e.g., ground) to stabilize the reference voltage. A first resistor (R1) 114 is coupled between the inverting input terminal of the operational amplifier 110 and ground to establish a current source (Iss=Vref/R1). Although not shown, a high feedback resistor (e.g., approximately 10 Mega-ohms) is generally coupled between the output terminal and the inverting terminal of the operational amplifier 110 to provide direct current (DC) stability to the output terminal of the operational amplifier 110.

The flip-flop circuit 116 outputs two alternately active signals (e.g., a Q output and a complementary Q output) to control the switches 102, 104, 106, 108 in the reversing switch array. For example, the first switch 102 and the fourth switch 104 are controlled by the Q output and operate as a first set of switches to couple the timing capacitor 100 in a first polarity between the output terminal and the inverting input terminal of the operational amplifier 110. The second switch 106 and the third switch 108 are controlled by the complementary Q output and operate as a second set of switches to couple the timing capacitor in a second polarity between the output terminal and the inverting input terminal of the operational amplifier 110.

The complementary Q output is provided to a data input (D) of the flip-flop circuit 116. The external clock signal is provided to a clock input (CLK) of the flip-flop circuit 116. In one embodiment, the outputs of the flip-flop circuit 116 change state at each rising edge of the external clock signal. The polarity of the timing capacitor 100 between the inverting input terminal and the output terminal of the operational amplifier 110 changes when the outputs of the flip-flop circuit 116 change state. The timing capacitor 100 is charged by the current source in a first direction when coupled in the first polarity and is charged by the current source in a second (or opposite) direction when coupled in the second polarity. A periodic ramp signal (Vramp) is provided at the output terminal of the operational amplifier 110 by periodically reversing the polarity (or connection) of the timing capacitor 110 between the inverting input terminal and the output terminal of the operation amplifier.

Figure 2:
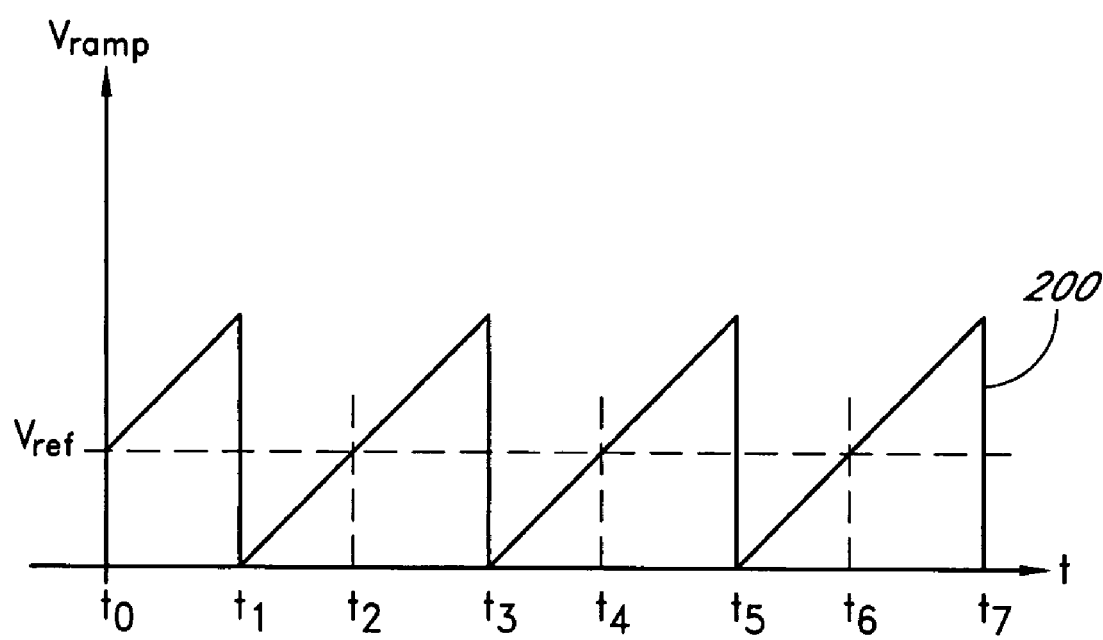
FIG. 2 is a timing diagram for one embodiment of a periodic ramp signal.

FIG. 2 is a timing diagram for one embodiment of a periodic ramp signal (Vramp). A graph 200 shows a saw tooth voltage signal (or an asymmetric ramp voltage that periodically resets to an initial value). For example, the saw tooth voltage signal includes a series of unidirectional (or positive-going) ramp voltages that increase linearly with time from the initial value (e.g., zero volt) to a final value (e.g., +5 volts). The saw tooth voltage signal resets (or drops from the final value to the initial value) to transition from one positive-going ramp voltage to the next positive-going ramp voltage (e.g., at times t1, t3, t5, t7). The ramp generator with the reversing switch array advantageously allows the charge on the timing capacitor 100 to remain approximately the same during reset (or the transition from one positive-going ramp voltage to the next positive-going ramp voltage).

Referring to FIG. 1, the periodic ramp signal (Vramp) is approximately equal to Vref+Vc when the first set of switches (S1 and S4) controlled by the Q output is active and is approximately equal to Vref−Vc when the second set of switches (S2 and S3) controlled by the complementary Q output is active. The term Vc corresponds to a voltage across the timing capacitor 100 with respect to its first terminal. In one embodiment, the reference voltage is approximately +2.5 volts.

In one embodiment, the first set of switches and the second set of switches change conduction states to transition from one positive-going ramp voltage to the next (or consecutive) positive-going ramp voltage of the periodic ramp signal. Referring to FIG. 2 for example, the first set of switches is active during times t1-t3 and t5-t7 while the second set of switches is active during time t3-t5. At time t1 (or t5), the voltage across the timing capacitor 100 is approximately −2.5 volts and the first set of switches starts to conduct to generate a positive-going ramp voltage. The positive-going ramp voltage is initially approximately zero volt and begins to increase as the timing capacitor 100 is charged by the current source in a first direction and the voltage across the timing capacitor 100 increases linearly with time $$\left(\text{e.g., } \Delta V_C = \frac{I_{SS} \times t}{C_T}\right).$$

The first set of switches turns off (e.g., at time t3 or t7) when the positive-going ramp voltage reaches a desired amplitude (e.g., approximately +5 volts or when voltage across the timing capacitor 100 is approximately +2.5 volts).

After the first set of switches turns off, the second set of switches turns on to generate the another positive-going ramp voltage in the periodic ramp signal. For example, the periodic ramp signal drops to approximately zero volt while the voltage across the timing capacitor 100 remains approximately +2.5 volts when the second set of switches starts to conduct at time t3. While the second set of switches conducts, the timing capacitor 100 is charged by the current source in a second (or different) direction and the voltage across the timing capacitor 100 decreases linearly with time. The second set of switches couples the timing capacitor 100 in a different polarity between the inverting input terminal and the output terminal of the operational amplifier. Thus, the periodic ramp signal increases to generate another positive-going ramp voltage from approximately zero volt to +5 volts while the voltage across the timing capacitor 100 decreases from +2.5 volts to −2.5 volts. When the voltage across the timing capacitor 100 is approximately −2.5 volts (e.g., at time t5), the second set of switches turns off and the first set of switches turns on to generate another positive-going ramp voltage.

Since the charge on the timing capacitor 100 does not change (or is approximately the same) during transitions from one positive-going ramp voltage to the next positive-going ramp voltage, the reset (or recovery) time between positive-going ramp voltages is relatively short (or effectively zero). In one embodiment, the timing capacitor 100 is approximately 1 microfarad and the reset time (e.g., duration when the periodic ramp signal falls from +5 volts to zero volt) is substantially determined by the slew rate of the operational amplifier 110 (or less than one microsecond). Thus, the periodic ramp signal can be advantageously used to generate signals with relatively high duty cycles in PWM systems. For example, the periodic ramp signal can be provided to a non-inverting input of a voltage comparator. An error or control signal is provided to an inverting input of the voltage comparator. The voltage comparator outputs a periodic rectangular waveform with a period determined by the periodic ramp signal and a duty cycle (or pulse-width) based on a comparison of the error signal to the periodic ramp signal.

Figure 3:
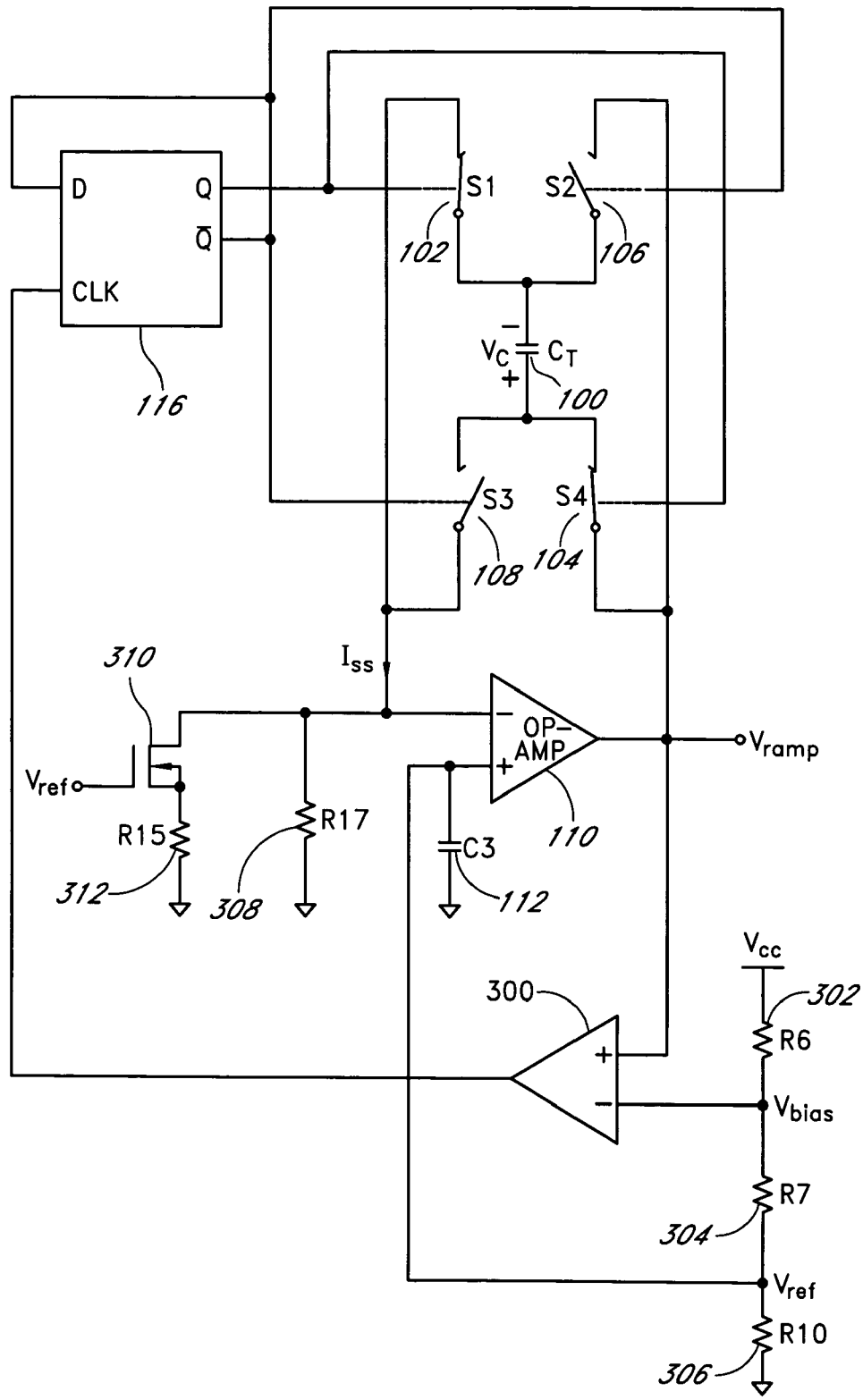
FIG. 3 illustrates one embodiment of a ramp generator with a frequency control input and a reversing switch array controlled by a flip-flop circuit using an internal clock signal.

FIG. 3 illustrates one embodiment of a ramp generator with a frequency control input (Vfc) and a reversing switch array controlled by a flip-flop circuit 116 using an internal clock signal. Similar to the embodiment shown in FIG. 1, the reversing switch array has four switches 102, 104, 106, 108 to selectively couple a timing capacitor 100 in alternating polarities between an inverting input terminal and an output terminal of an operational amplifier 110. The switches 102, 104, 106, 108 are also controlled by outputs of the flip-flop circuit 116 to generate a voltage ramp signal (Vramp) at the output terminal of the operational amplifier.

The ramp generator shown in FIG. 3 further includes a comparator 300 for generating the internal clock signal for the flip-flop circuit 116. In one embodiment, the voltage ramp signal is provided to a non-inverting input terminal of the comparator 300. A bias voltage (Vbias) corresponding to a desired amplitude of the voltage ramp signal is provided to an inverting input terminal of the comparator 300. An output terminal of the comparator 300 provides a pulse to a clock input of the flip-flop circuit 116 when the voltage ramp signal reaches (or is greater than) the bias voltage and the outputs of the flip-flop circuit 116 change states accordingly to start a new voltage ramp.

The ramp generator shown in FIG. 3 also includes a variable current source coupled to the inverting input terminal of the operational amplifier 110. For example, a first resistor (R17) 308 is coupled between the inverting input terminal of the operational amplifier 110 and ground. A transistor (Q4) 310 is coupled in series with a second resistor (R15) 312 between the inverting input terminal of the operational amplifier 110 and ground. The transistor 310 operates as a variable resistor. In one embodiment, the transistor 310 is a MOSFET and the frequency input control is a variable voltage applied to a gate terminal of the transistor 310 to adjust a resistance (RQ4) between source-to-drain terminals of the transistor 310. A reference voltage (Vref) is provided to a non-inverting input terminal of the operational amplifier 110. Thus, the level of the current source has the following relationship:

$$I_{SS} = \frac{V_{ref}(R17 + RQ4 + R15)}{R17(RQ4 + R15)}.$$

The level of the current source is variable by changing the value of the frequency input control to the transistor 310. Varying the level of the current source varies the frequency of the periodic ramp signal. For example, increasing the level of the current source decreases the time that the periodic ramp signal takes to reach the bias voltage, and thus increases the frequency of the periodic ramp signal. Conversely, decreasing the level of the current source increases the time that the periodic ramp signal takes to reach the bias voltage, and thus decreases the frequency of the periodic ramp signal.

In one embodiment, the bias voltage and the reference voltage are generated using a resistor string (or voltage divider) coupled between a supply voltage (Vcc) and ground. For example, a resistor R6 (100 ohms) 302, a resistor R7 (1 kilo-ohms) 304 and a resistor R10 (1.1 kilo-ohms) 306 are coupled in series from the supply voltage (e.g., +5 volts) to ground. The bias voltage (e.g., approximately +4.8 volts) is generated at a common node between the resistor R6 302 and the resistor R7 304. The reference voltage (e.g., approximately +2.5 volts) is generated at a common node between the resistor R7 304 and the resistor R10 306.

Figure 4:
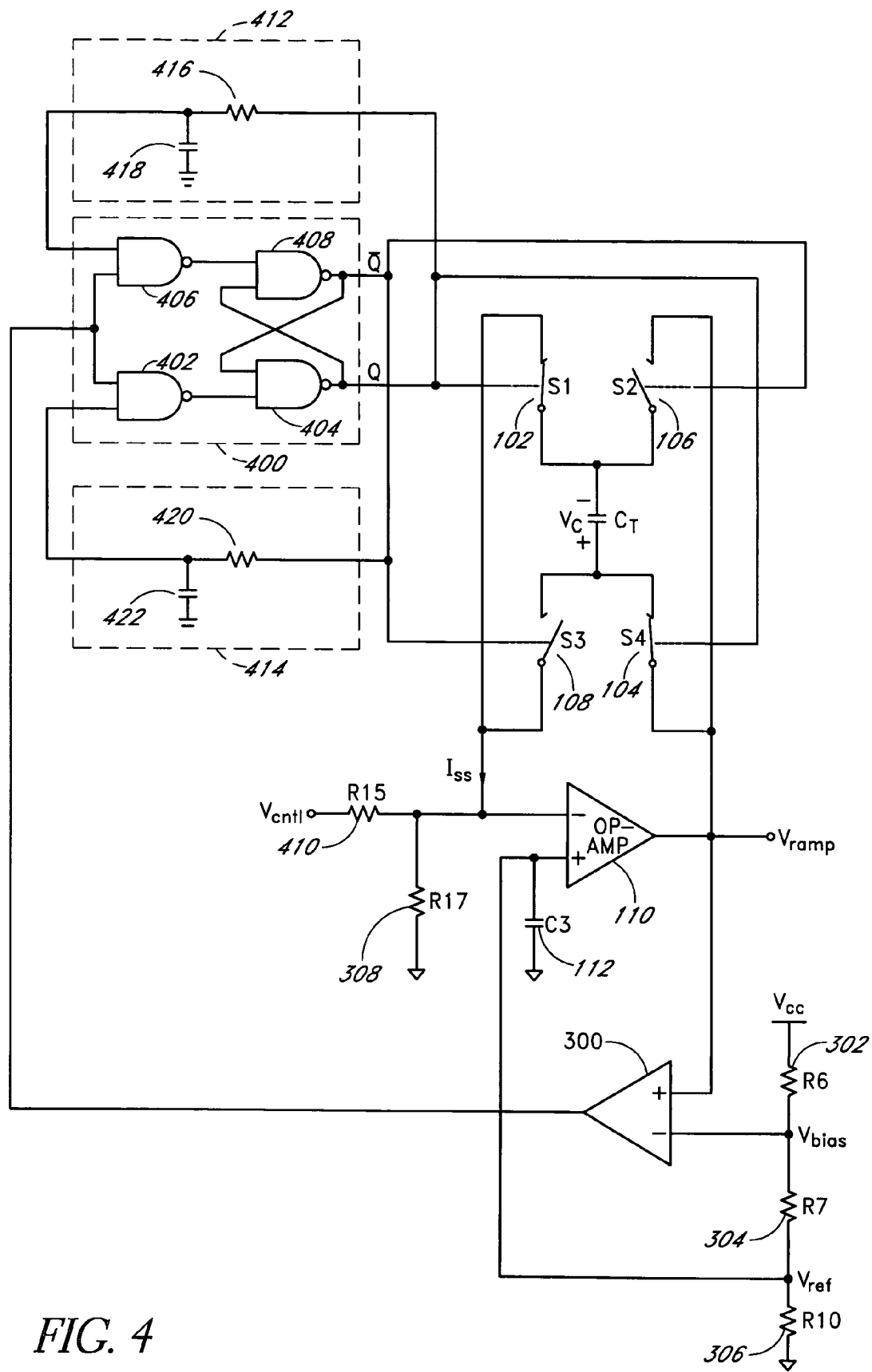
FIG. 4 illustrates one embodiment of a ramp generator with a frequency control input and a reversing switch array controlled by a latch circuit using an internal clock signal.

FIG. 4 illustrates one embodiment of a ramp generator with a frequency control input voltage (Vcnt1) and a reversing switch array controlled by a latch circuit 400 using an internal clock signal. Similar to the embodiment shown in FIG. 1, the reversing switch array has four switches 102, 104, 106, 108 to periodically reverse the polarity of a capacitor 100 between an output terminal and an inverting input terminal of an operational amplifier 110. However, the switches 102, 104, 106, 108 are controlled by alternately active outputs (e.g., a Q output and a complementary Q output) of the latch circuit 400.

Different combinations of logic gates can be used to implement the latch circuit 400. In the embodiment shown in FIG. 4, the latch circuit 400 is realized with four logic NAND gates 402, 404, 406, 408. The first logic NAND gate 402 has a first input coupled to the internal clock signal, a second input coupled to a first feedback signal and an output coupled to a first input of the second logic NAND gate 404. The second logic NAND gate 404 has a second input coupled to an output of the fourth NAND gate 408 and an output that provides the Q output of the latch circuit 400. The third logic NAND gate 406 has a first input coupled to the internal clock signal, a second input coupled to a second feedback signal and an output coupled to a first input of the fourth logic NAND gate 408. The fourth NAND gate 408 has a second input coupled to the output of the second NAND gate 404 and the output that provides the complementary Q output of the latch circuit 400.

In one embodiment, the first and the second feedback signals are low-pass filtered versions of the complementary Q and the Q outputs of the latch circuit 400. For example, the complementary Q output is processed by a first filter circuit 414 to generate the first feedback signal. The Q output is processed by a second filter circuit 412 to generate the second feedback signal. In one embodiment, the first and the second filter circuits 414, 412 are simple RC filters with approximately equal time constants. In the embodiment shown in FIG. 4, the Q and the complementary Q outputs of the latch circuit 400 change states in response to the internal clock signal. Similar to FIG. 3, the ramp generator in FIG. 4 includes a comparator 300 for generating the internal clock signal and a resistor string to generate a bias voltage for the comparator in addition to a reference voltage (Vref) coupled to a non-inverting input terminal of the operational amplifier 110. To ensure stable operations, the time constants of the first and the second feedback circuits 414, 412 are longer (e.g., approximately five times) the combined response times of the operational amplifier 110 and the comparator 300.

The ramp generator shown in FIG. 4 also includes a variable current source coupled to the inverting input terminal of the operational amplifier 110. In one embodiment, the variable current source includes a first resistor (R17) 308 coupled between the inverting input terminal of the operational amplifier 110 and ground and a second resistor (R15) 410 coupled between the inverting input terminal of the operational amplifier 110 and the frequency control input voltage (Vcnt1). Thus, the level of the current source has the following relationship:

$$Iss = \frac{Vref}{R17} + \frac{Vref - Vcntl}{R15}.$$

The level of the current source is variable by changing the level of the frequency control input voltage. For example, increasing the frequency control input voltage decreases the current source and thereby decreases the frequency of the internal clock signal. Decreasing the frequency control input voltage increases the current source and thereby increases the frequency of the internal clock signal.

Various embodiments have been described above. Although described with reference to these specific embodiments, the descriptions are intended to be illustrative and are not intended to be limiting. Various modifications and applications may occur to those skilled in the art without departing from the true spirit and scope of the invention as defined by the appended claims.

What is claimed is:

1. A ramp generator comprising:
a capacitor with a first terminal and a second terminal;
an operational amplifier configured to provide a periodic ramp signal at an output terminal, wherein a non-inverting input terminal is coupled to a reference voltage and an inverting input terminal is coupled to a current source;
a switch array configured to couple the capacitor between the inverting input terminal and the output terminal of the operational amplifier, wherein the switch array periodically reverses polarity of the capacitor between the inverting input terminal and the output terminal of the operational amplifier by coupling the first terminal of the capacitor to the inverting input terminal of the operational amplifier while the second terminal of the capacitor is coupled to the output terminal of the operational amplifier during a first duration of a period and coupling the second terminal of the capacitor to the inverting input terminal of the operational amplifier while the first terminal of the capacitor is coupled to the output terminal of the operational amplifier during a second duration of the period, and wherein the capacitor does not substantially discharge in a transition between the first duration and the second duration of each period; and
a flip-flop circuit configured to control the switch array, wherein the flip-flop circuit outputs two alternately active signals with frequencies determined by a clock signal and the clock signal is generated by comparing the periodic ramp signal to a bias voltage.

2. A ramp generator comprising:
a capacitor with a first terminal and a second terminal;
an operational amplifier configured to provide a periodic ramp signal at an output terminal, wherein a non-inverting input terminal is coupled to a reference voltage and an inverting input terminal is coupled to a current source;
a switch array configured to couple the capacitor between the inverting input terminal and the output terminal of the operational amplifier, wherein the switch array periodically reverses polarity of the capacitor between the inverting input terminal and the output terminal of the operational amplifier by coupling the first terminal of the capacitor to the inverting input terminal of the operational amplifier while the second terminal of the capacitor is coupled to the output terminal of the operational amplifier during a first duration of a period and coupling the second terminal of the capacitor to the inverting input terminal of the operational amplifier while the first terminal of the capacitor is coupled to the output terminal of the operational amplifier during a second duration of the period, and wherein the capacitor does not substantially discharge in a transition between the first duration and the second duration of each period; and a flip-flop circuit configured to control the switch array, wherein the flip-flop circuit outputs two alternately active signals with frequencies determined by a clock signal and the frequency of the clock signal is variable by adjusting the level of the current source coupled to the inverting input terminal of the operational amplifier.

3. A ramp generator comprising:

a capacitor with a first terminal and a second terminal;

an operational amplifier configured to provide a periodic ramp signal at an output terminal, wherein a non-inverting input terminal is coupled to a reference voltage and an inverting input terminal is coupled to a current source;

a switch array configured to couple the capacitor between the inverting input terminal and the output terminal of the operational amplifier, wherein the switch array periodically reverses polarity of the capacitor between the inverting input terminal and the output terminal of the operational amplifier by coupling the first terminal of the capacitor to the inverting input terminal of the operational amplifier while the second terminal of the capacitor is coupled to the output terminal of the operational amplifier during a first duration of a period and coupling the second terminal of the capacitor to the inverting input terminal of the operational amplifier while the first terminal of the capacitor is coupled to the output terminal of the operational amplifier during a second duration of the period, and wherein the capacitor does not substantially discharge in a transition between the first duration and the second duration of each period; and a latch circuit configured to control the switch array wherein the latch circuit outputs two alternately active signals with frequencies determined by a clock signal and the clock signal is generated by sensing the amplitude of the periodic ramp signal.

4. A ramp generator comprising:

a capacitor with a first terminal and a second terminal;

an operational amplifier configured to provide a periodic ramp signal at an output terminal, wherein a non-inverting input terminal is coupled to a reference voltage and an inverting input terminal is coupled to a current source;

a switch array configured to couple the capacitor between the inverting input terminal and the output terminal of the operational amplifier, wherein the switch array periodically reverses polarity of the capacitor between the inverting input terminal and the output terminal of the operational amplifier by coupling the first terminal of the capacitor to the inverting input terminal of the operational amplifier while the second terminal of the capacitor is coupled to the output terminal of the operational amplifier during a first duration of a period and coupling the second terminal of the capacitor to the inverting input terminal of the operational amplifier while the first terminal of the capacitor is coupled to the output terminal of the operational amplifier during a second duration of the period, and wherein the capacitor does not substantially discharge in a transition between the first duration and the second duration of each period; and a latch circuit configured to control the switch array, wherein the latch circuit outputs two alternately active signals with frequencies determined by a clock signal and the frequency of the clock signal is adjustable by varying the current source.

5. A ramp generator comprising:

a capacitor with a first terminal and a second terminal;

an operational amplifier configured to provide a periodic ramp signal at an output terminal, wherein a non-inverting input terminal is coupled to a reference voltage and an inverting input terminal is coupled to a current source, the current source comprising:

a first resistor coupled between the inverting input terminal of the operational amplifier and a reference node; and a second resistor coupled between a control voltage and the inverting input terminal of the operational amplifier, wherein the control voltage is variable to adjust the level of the current source; and a switch array configured to couple the capacitor between the inverting input terminal and the output terminal of the operational amplifier, wherein the switch array periodically reverses polarity of the capacitor between the inverting input terminal and the output terminal of the operational amplifier by coupling the first terminal of the capacitor to the inverting input terminal of the operational amplifier while the second terminal of the capacitor is coupled to the output terminal of the operational amplifier during a first duration of a period and coupling the second terminal of the capacitor to the inverting input terminal of the operational amplifier while the first terminal of the capacitor is coupled to the output terminal of the operational amplifier during a second duration of the period, and wherein the capacitor does not substantially discharge in a transition between the first duration and the second duration of each period.

6. A ramp generator comprising:

a capacitor;

an operational amplifier configured to provide a periodic ramp signal at an output terminal, wherein a non-inverting input terminal is coupled to a reference voltage and an inverting input terminal is coupled to a current source, wherein the current source comprises a first resistor coupled in parallel with a voltage-controlled variable-resistive network between the inverting input terminal of the operational amplifier and a reference node; and a switch array configured to couple the capacitor between the inverting input terminal and the output terminal of the operational amplifier, wherein the switch array periodically reverses polarity of the capacitor between the inverting input terminal and the output terminal of the operational amplifier.

7. The ramp generator of claim 6, wherein the periodic ramp signal is provided to a voltage comparator to establish time intervals and to generate a variable pulse-width signal in a pulse-width-modulation system.

8. A method to generate a periodic ramp signal, the method comprising:

coupling a reference voltage to a non-inverting input terminal of an operational amplifier;

coupling a current source to an inverting input terminal of the operational amplifier; and using a switch array to couple a capacitor between the inverting input terminal and an output terminal of the operational amplifier and to periodically reverse polarity of the capacitor between the inverting input terminal and the output terminal of the operational amplifier, wherein the periodic ramp signal is provided at the output terminal of the operational amplifier and periodically reversing polarity of the capacitor between the inverting input terminal and the output terminal of the operational amplifier further comprises:

coupling the output terminal of the operational amplifier to a first terminal of the capacitor and coupling the inverting input terminal of the operational amplifier to a second terminal of the capacitor during a first duration of a period; and coupling the output terminal of the operational amplifier to the second terminal of the capacitor and coupling the inverting input terminal of the operational amplifier to the first terminal of the capacitor during a second duration of the period, wherein the capacitor does not substantially discharge in a transition between the first duration and the second duration of each period.

9. A method to generate a periodic ramp signal, the method comprising:

coupling a reference voltage to a non-inverting input terminal of an operational amplifier;

coupling a current source to an inverting input terminal of the operational amplifier; and using a switch array to couple a capacitor between the inverting input terminal and an output terminal of the operational amplifier, wherein the switch array periodically reverses polarity of the capacitor between the inverting input terminal and the output terminal of the operational amplifier, the periodic ramp signal is provided at the output terminal of the operational amplifier, the switch array comprises a first set and a second set of semiconductor switches that alternately conduct, the periodic ramp signal increases from an initial value to a final value when the first set of semiconductor switches conduct such that the current source charges the capacitor in a first direction, the periodic ramp signal increases from the initial value to the final value when the second set of semiconductor switches conduct such that the current source charges the capacitor in a second direction, the periodic ramp signal drops from the final value to the initial value without substantial changes to charges on the capacitor when the first set and the second set of semiconductor switches change conductions states, and the capacitor is not periodically disconnected from the operational amplifier for resetting to a reference level.

10. The method of claim 8, further comprising controlling the switch array with a flip-flop circuit synchronized to an external clock signal.

11. The method of claim 8, further comprising controlling the switch array with a flip-flop circuit synchronized to an internal clock signal, wherein the internal clock signal is generated by monitoring the periodic ramp signal amplitude.

12. The method of claim 11, wherein the frequency of the internal clock signal is variable by adjusting the current source.

13. The method of claim 9, further comprising controlling the switch array with a latch circuit.

14. The ramp generator of claim 6, wherein the switch array comprises:

a first semiconductor switch coupled between a first terminal of the capacitor and the inverting input terminal of the operational amplifier;

a second semiconductor switch coupled between the first terminal of the capacitor and the output terminal of the operational amplifier;

a third semiconductor switch coupled between a second terminal of the capacitor and the inverting input terminal of the operational amplifier; and a fourth semiconductor switch coupled between the second terminal of the capacitor and the output terminal of the operational amplifier, wherein the first semiconductor switch and the fourth semiconductor switch operate as a first pair of switches to couple the capacitor in a first polarity between the output terminal and the inverting input terminal of the operational amplifier during a first duration of a period, the second semiconductor switch and the third semiconductor switch operate as a second pair of switches to couple the capacitor in a second polarity between the output terminal and the inverting input terminal of the operational amplifier during a second duration of the period, and the capacitor does not substantially discharge in a transition between the first duration and the second duration of each period.

15. The ramp generator of claim 6, further comprising a flip-flop circuit configured to control the switch array, wherein the flip-flop circuit outputs two alternately active signals with frequencies determined by a clock signal.

16. The ramp generator of claim 6, further comprising a latch circuit configured to control the switch array, wherein the latch circuit outputs two alternately active signals with frequencies determined by a clock signal.

17. The method of claim 9, further comprising controlling the switch array with a flip-flop circuit synchronized to an external clock signal.

18. The method of claim 9, further comprising controlling the switch array with a flip-flop circuit synchronized to an internal clock signal generated based in part on the periodic ramp signal.

19. The method of claim 18, wherein the frequency of the internal clock signal is variable by adjusting the current source.

20. The method of claim 9, further comprising controlling the switch array with a latch circuit.

* * * * *

UNITED STATES PATENT AND TRADEMARK OFFICE
CERTIFICATE OF CORRECTION

PATENT NO. : 7,388,413 B1 Page 1 of 1
APPLICATION NO. : 11/181649
DATED : June 17, 2008
INVENTOR(S) : Newton E. Ball It is certified that error appears in the above-identified patent and that said Letters Patent is hereby corrected as shown below:

Column 7, Line 7 (Approx.), delete "(Vcnt1)" and insert -- (Vcntl) --, therefor.

Column 7, Line 66 (Approx.), delete "(Vcnt1)." and insert -- (Vcntl). --, therefor.

Column 9, Line 41, in Claim 3, after "array" insert -- , --.

Column 12, Line 6, in Claim 13, delete "claim 9," and insert -- claim 8, --, therefor.

Signed and Sealed this

Sixteenth Day of December, 2008

JON W. DUDAS
*Director of the United States Patent and Trademark Office*